United States Patent
Mörz et al.

(10) Patent No.: US 12,093,488 B2
(45) Date of Patent: Sep. 17, 2024

(54) SIGNAL EVALUATION METHOD

(71) Applicant: MERCEDES-BENZ GROUP AG, Stuttgart (DE)

(72) Inventors: Sebastian Mörz, Sindelfingen (DE); Jürgen Oehmen, Karlsruhe (DE); Matthias Winkler, Lichtenwald (DE)

(73) Assignee: MERCEDES-BENZ GROUP AG, Stuttgart (DE)

( * ) Notice: Subject to any disclaimer, the term of this patent is extended or adjusted under 35 U.S.C. 154(b) by 0 days.

(21) Appl. No.: 18/563,482

(22) PCT Filed: May 13, 2022

(86) PCT No.: PCT/EP2022/062998
§ 371 (c)(1),
(2) Date: Nov. 22, 2023

(87) PCT Pub. No.: WO2022/248243
PCT Pub. Date: Dec. 1, 2022

(65) Prior Publication Data
US 2024/0281094 A1    Aug. 22, 2024

(30) Foreign Application Priority Data

May 26, 2021 (DE) .................. 10 2021 002 801.5

(51) Int. Cl.
*G06F 3/044* (2006.01)
*G06F 3/041* (2006.01)

(52) U.S. Cl.
CPC .......... *G06F 3/04186* (2019.05); *G06F 3/044* (2013.01)

(58) Field of Classification Search
CPC ............................ G06F 3/04186; G06F 3/044
See application file for complete search history.

(56) References Cited

U.S. PATENT DOCUMENTS

| 8,773,394 B2 | 7/2014 | Suzuki |
| 2010/0156839 A1 | 6/2010 | Ellis |

(Continued)

FOREIGN PATENT DOCUMENTS

| DE | 102012204921 A1 | 10/2012 |
| WO | 2014143200 A1 | 9/2014 |

OTHER PUBLICATIONS

International Search Report and Written Opinion mailed Sep. 22, 2022 in related/corresponding International Application No. PCT/EP2022/062998.

(Continued)

*Primary Examiner* — Jonathan A Boyd
(74) *Attorney, Agent, or Firm* — PATENT PORTFOLIO BUILDERS PLLC

(57) ABSTRACT

Signal of inputs made by a finger on a touch-sensitive capacitive operating element are evaluated by calculating a finger position from sensor strokes of individual capacitive sensors. The calculated finger position is not output if a difference between the maximum and minimum sensor stroke of the sensors is smaller than a preset value or smaller than the error tolerance of the sensors. The finger position is output if the difference between the maximum and minimum sensor stroke of the sensors is greater than the first preset value and if the sensor stroke of a sensor closest to the detected finger position at the edge of the touch-sensitive capacitive operating element is smaller than a second preset value.

7 Claims, 5 Drawing Sheets

(56) References Cited

U.S. PATENT DOCUMENTS

| | | |
|---|---|---|
| 2010/0229090 A1 | 9/2010 | Newton et al. |
| 2014/0160060 A1* | 6/2014 | Chiu .................. G06F 3/04186 |
| | | 345/174 |
| 2016/0344386 A1 | 11/2016 | Buttolo et al. |
| 2017/0131841 A1 | 5/2017 | Chang |
| 2017/0305453 A1 | 10/2017 | Nishio et al. |

OTHER PUBLICATIONS

Office Action created Dec. 22, 2021 in related/corresponding DE Application No. 10 2021 002 801.5.

* cited by examiner

| Operating step | 1.1 | 1.2 | 1.3 | 1.4 | 1.5 |
|---|---|---|---|---|---|
| Finger movement (calculated) | N/A | + | + | - | - |
| Finger movement (actual) | N/A | - | - | - | - |
| $H_{min} > f1 * \Delta [min, max]$ | FALSE | TRUE | FALSE | FALSE | FALSE |
| $H_{upper} < f2 * H_{max}$ | TRUE | FALSE | FALSE | TRUE | TRUE |
| Suppression of output | FALSE | TRUE | TRUE | FALSE | FALSE |
| Finger movement (output) | N/A | N/A | N/A | - | - |

Fig. 6

| Operating step | 2.1 | 2.2 | 2.3 | 3.1 | 3.2 | 3.3 |
|---|---|---|---|---|---|---|
| Finger movement (calculated) | - | - | - | + | + | + |
| Finger movement (actual) | - | - | - | + | + | + |
| $H_{min} > f1 * \Delta [min, max]$ | FALSE | FALSE | FALSE | FALSE | FALSE | FALSE |
| $H_{upper} < f2 * H_{max}$ | TRUE | TRUE | TRUE | TRUE | TRUE | (FALSE) |
| Suppression of output | FALSE | FALSE | FALSE | FALSE | FALSE | FALSE |
| Finger movement (output) | - | - | - | + | + | + |

Fig. 7

SIGNAL EVALUATION METHOD

BACKGROUND AND SUMMARY OF THE INVENTION

Exemplary embodiments of the invention relate to a method for evaluating the signal of inputs made by a finger on a touch-sensitive capacitive operating element, as well as to a touch-sensitive operating element for carrying out the method.

For example, a sensor surface of a touch-sensitive control element is known from US 2010/0229090 A1 in which a finger position is determined as a centroid from different sensor signals. With comparatively large-area touch-sensitive elements, this solution is quite acceptable. With smaller touch pads which can be used, for example, to adjust the volume of a media system or the like, this can be problematic, likewise with inputs with relatively small finger movement radii. When there is a correspondingly wide contact by the finger, this namely causes different sensors to be excited within the area, wherein the differences in the sensor strokes of these sensors are relatively small, so that even a slight tilting or a rolling movement of the finger leads to an undesired displacement of a finger position calculated from the sensor strokes or from their centroid or surface center.

In addition, DE 10 2012 204 921 A1 discloses a vehicle operating device which can be actuated by a sliding movement made by a finger, wherein inputs made with too little force are ignored.

In placing of the finger, the placement on the one hand and the subsequent tilting or rolling of the finger on the other hand can already result in an operation before the actually intended operation, for example an unintended movement of the finger position in the one direction, even though a movement in the other direction was wanted. In practice, in particular with the above-mentioned rather small touch pads with, for example, a series of capacitive sensors, this frequently leads to an unintended control input in which, for example, the volume that is to be reduced, for example, initially becomes louder from the placement and tilting or rolling of the finger before it is reduced by the finger movement. In addition to this simple example, other controls are also not very convenient in practice if they already trigger control processes during the placement of the finger, which then in particular also run contrary to the actually desired and intended control.

Exemplary embodiments of the present invention are directed to an improved method for signal evaluation that avoids or at least greatly reduces the aforementioned disadvantage in order to thereby provide convenient and efficient control of touch-sensitive capacitive operating elements. Exemplary embodiments of the invention are also directed to a touch-sensitive operating element suitable for the method.

The inventive solution involves a method in which a finger position of a wiping movement calculated from the sensor strokes is not output or is discarded in certain cases, that is to say is not output to a controller connected to the sensor, for example a cursor on a screen, a volume controller, or the like. This is always the case when a large-area coverage of the entire operating element, that is to say several adjacent sensors, is identified, so that, for example, a difference between the maximum sensor stroke of one of the sensors and the minimum sensor stroke of one of the sensors at the same time is less than a preset value. In the present case, the sensor stroke is understood to mean the level of a signal output by the sensor, for example a voltage, a capacitance, or possibly a frequency which is converted for further processing in a control device, preferably into a digital value representing several states.

Furthermore, if the difference between the maximum and minimum sensor stroke of the sensors is greater than the first preset value, the finger position is only output if the sensor stroke of a sensor closest to the detected finger position at the edge of the touch-sensitive capacitive operating element is smaller than a second preset value. The sensor signal, caused by a finger touch, of the sensor(s) closest to the detected finger position at the edge of the sensor field are compared with the second preset value. Located at the edge, i.e., at the outer edge, refers to the sensors that border the sensor field at least in one direction, preferably in the direction of movement of the operating finger. In other words, the sensor stroke of the sensor $H_{upper}$ of a detected finger position is compared with the second preset value, which borders the sensor field in the direction of movement of the operating finger.

A second preset value is therefore introduced here, which then supplements the first preset value. Comparison with the second preset value ensures that a detected changed finger position in comparison to a previously determined one, preferably in a predetermined direction of movement on the operating element is actually caused by a specific wiping movement with a corresponding finger position and not by rolling the finger.

By suppressing the output of the finger position in these variants, an initial faulty operation or at least an initial potential faulty operation can be cushioned so that, with the touch-sensitive capacitive control element, as far as possible, only those inputs are implemented and passed on to a subsequent control which were intended by the user. This virtually filters out potential incorrect inputs during placement of the finger and when the finger rolls or tilts which frequently occurs afterwards, which is especially the case with touch-sensitive control elements in the area of a steering wheel.

According to an advantageous further development of the method according to the invention, a proportional dependence can preferably be realized so that the smaller the first preset value is, the smaller will be the permissible difference between the maximum and the minimum sensor stroke of the sensors from which no output takes place.

According to another very advantageous embodiment, the preset value can depend on the minimum sensor stroke and/or an error tolerance of the sensors. In a simple variant, it can be formed directly by the minimum sensor stroke, or can preferably be formed by the minimum sensor stroke, wherein either the minimum sensor stroke or the difference between the maximum and the minimum sensor stroke of the sensors are multiplied by a corresponding factor. This factor can be, for example, a factor resulting from the hardware used, which is multiplied by the minimum sensor stroke or the difference, for example.

The two solution variants, that is to say the use of the minimum sensor stroke and/or the error tolerance of the sensors as the first preset value, can also be used in combination with one another in order to therefore correspondingly connect both conditions in the one or the other order of checking, or by parallel checking and a subsequent AND-link or preferably a subsequent OR-link, and on this basis to decide on the output of the determined finger position, i.e., either to discard it or to correspondingly use it for the input. In two steps, for example, it is checked whether the difference ($\Delta(min, max)$) between the maximum and minimum sensor stroke (Hmax, Hmin) of the sensors (3a, 3b, 3c, 3d) is greater than the first preset value, wherein the first preset value is dependent on the minimum sensor stroke ($H_{min}$) in a first check, and on the error tolerance of one of the sensors (3a, 3b, 3c, 3d) in a second check. If necessary, if the sensor stroke ($H_{upper}$) is less than the calculated preset value, the calculated finger position (5) is output when both the first check and the second check are satisfied, or if at least one of the first or second checks is satisfied.

The supplementary or alternative variant in which the position of the finger is only output when the difference between the maximum and the minimum sensor stroke of the sensors is greater than the error tolerance of the, or of at least one of the, sensors ultimately leads to a similar result as an alternative or supplementary solution because here too, a type of preset value is in fact generated that is within the error tolerance of the individual sensors and accordingly, like the other solution, causes sensor strokes which are too small and in particular are distributed over too many sensors to be more or less interpreted as complete coverage or full surface coverage of the sensors and accordingly does not lead to an output of the determined finger position.

According to a highly advantageous development of the method according to the invention, it can be provided that the second preset value is dependent on the maximum sensor stroke, wherein here as well, a hardware-dependent factor in particular can be used in particular on the one or on the other side of an equation underlying the condition.

In particular, the example of the above-mentioned volume slider in a vehicle steering wheel makes it clear that, when there is largely complete coverage of the sensor by the finger, major fluctuations of the calculated finger position between the individual sensors and the position assigned thereto can occur. In practice, it is found that these fluctuations can be measured as high-frequency oscillations of the output signal on the corresponding data buses of the vehicle. In order not to make the result dependent on this and in particular to prevent, for example, a fast and uncontrolled "twitching" of the cursor when controlling a cursor, it can also be provided in accordance with a further very advantageous embodiment of the method according to the invention that all changes in the finger positions that are based on a detected finger speed above a defined maximum movement speed are not output. Excessively fast movements or high-frequency oscillations of the detected finger movements can therefore be discarded because they more or less do not play any role in the actual control, and are therefore practically always accompanied by a misinterpretation of the actually desired control.

The maximum movement speed depends individually on the particular person operating the operating element and on their way of placing their finger. In addition, ergonomic conditions in the surroundings of the operating element play a role. For example, a steering wheel is often controlled via the thumb. The position of the hand on the steering wheel, the size of the hand and the like will then play a decisive role. It therefore makes sense, and is therefore also provided according to a highly advantageous further development of the method according to the invention, for the maximum speed of movement to be adapted to the individual user in a self-learning manner based on a global starting value. During delivery, the control element or its controller has a global start value which is based, for example, on determined average values. Over time, the system learns the user-specific high-frequency oscillations it detects when the user accordingly operates the operating element. From these detected values, an individual profile of the user can then be determined in a self-learning manner so that the system adapts to the corresponding user and recognizes from the usually performed rolling movements or tilting movements of his finger per se and, in addition to the two methods according to the invention, also at least partially filters them out via a speed analysis.

In an advantageous additional or alternative embodiment, if the difference ($\Delta(min, max)$) between the maximum and minimum sensor stroke ($H_{max}$, $H_{min}$) of the sensors of two successive finger positions is always greater than the first preset value, the comparison of the sensor stroke ($H_{upper}$) with the second preset value will be omitted for the last finger position, and the output of the finger position takes place. Even if the sensor stroke ($H_{upper}$) of a sensor closest to the detected finger position at the edge of the touch-sensitive capacitive operating element is greater than the second preset value, in this case the finger position will nevertheless be output. Preferably, this comparison is omitted only in a predefined direction of movement. When there is a control element arranged on the steering wheel, for example for adjusting the volume, the comparison of ($H_{upper}$) with the second preset value is taken into account for a first movement from top to bottom and is not taken into account for a further movement from bottom to top. The background of this distinction is that, during the first movement, an incorrect finger position not corresponding to the intention of the operator would be determined from rolling, but the specific finger position in the second movement corresponds precisely to the intention of the operator.

It is true that only the direction of the recognized finger movement, preferably downwards, could be taken into account in order to cushion potential incorrect inputs caused by rolling in the supposedly wrong direction as soon as the overriding correct direction of the finger movement has once been recognized correctly. However, if a user decides to reverse the input direction during an input in one direction, and however continues the input in the other, opposite direction, this would lead to unavoidable errors.

A hysteresis can therefore be defined in order to clearly recognize when sensor data that are comparable or identical are either discarded because they still originate from a misinterpretation caused by the rolling or tilting of the finger, or when the data are output because they supposedly originate from a conscious movement and possibly a change in the direction of movement thus achieved by the user.

The method according to the invention in all its described embodiment variants and combinations of these embodiment variants can in principle be accordingly used for any type of touch-sensitive operating elements. However, it is particularly preferred that the touch-sensitive operating element is provided with a computing unit for performing such a method and with a plurality of capacitive sensors arranged in a row. In the intended use, these can preferably be operated in a direction of movement from bottom to top and vice versa. The method according to the invention can therefore preferably be used for such a touchpad which can be used, for example, as a volume slider, preferably in the steering wheel of a vehicle.

Advantageous embodiments of the method according to the invention also result from the exemplary embodiment which will be described in more detail below with reference to the figures.

BRIEF DESCRIPTION OF THE DRAWING FIGURES

In the figures:

FIG. 6 shows a tabular representation as a supplement to the graphic representation of the sequence in FIG. 5;

FIG. 7 shows a tabular representation for the cases according to FIG. 3 and FIG. 4.

DETAILED DESCRIPTION

Figure 1:
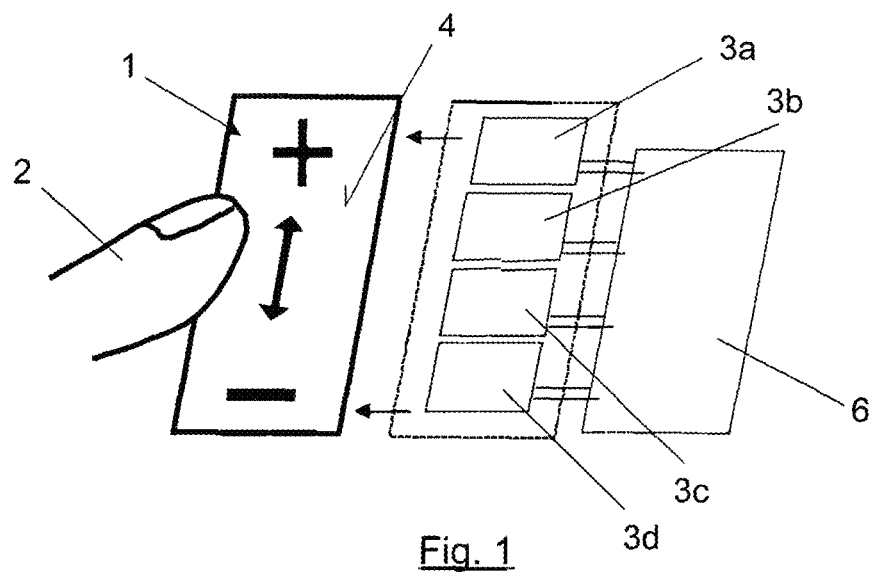
FIG. 1 shows a schematic illustration of an operating element in the form of a volume slider.

Capacitive operating elements 1 are present everywhere as input devices for man-machine interfaces and are typically referred to as touchscreens or touchpads and are operated by a finger 2. The detection of the finger position 5 (cf. FIG. 2) is typically based on the assumption that the actual finger position 5 is being calculated from the raw sensor data, for example via a centroid formation, as is described in the prior art mentioned in the introduction. This means, in particular, that the contact surface between the finger 2 and a sensor surface 4 of the operating element 1 does not change during operation, or at most changes symmetrically, for example by a perpendicular approach of the fingertip to the control element 1. In real situations, however, this assumption is rarely fulfilled, in particular not when the operating element 1 is not well-positioned ergonomically, for example in a steering wheel, so that the operation is not performed vertically from above but rather, for example, by a thumb which is stretched from a hand gripping the rim of the steering wheel in the direction of the operating element 1 in order to correspondingly operate it. Without being restricted to such an operating element 1, the following exemplary embodiment will now be described with reference a volume slider in a steering wheel that is vertically oriented and is used, for example, to change the volume of the audio output of a telematics system. In the illustration in FIG. 1, such a volume slider is schematically indicated as an operating element 1. The arrangement in the steering wheel typically results in the user not guiding his fingertip, designated here as 2, vertically over the surface of the control element 1, as is the case with screens, but rather operating the control element 1 with a finger 2 at an angle.

A common and quite problematic operating pattern is a rolling movement of the fingertip, which stimulates the operating element 1 or its capacitive sensors located under the surface 4, here designated 3a, 3b, 3c, 3d, in such a way that the movement of the finger 2 calculated in a computing unit 6 is opposite to the actual movement. This will be described below using the example of such a movement in the illustration in FIG. 2. The surface 4 of the operating element 1 together with the finger 2 is accordingly shown in FIG. 2. In the illustration on the right-hand side next to the operating surface, the sensor strokes H of the individual capacitive sensors 3a to 3d are indicated by x in each case. The dashed line qualitatively represents a deflection of the sensors 3a to 3d interpolated or calculated according to other mathematical methods. The arrow denoted by 5 in each case symbolizes the detected finger position.

Figure 2:
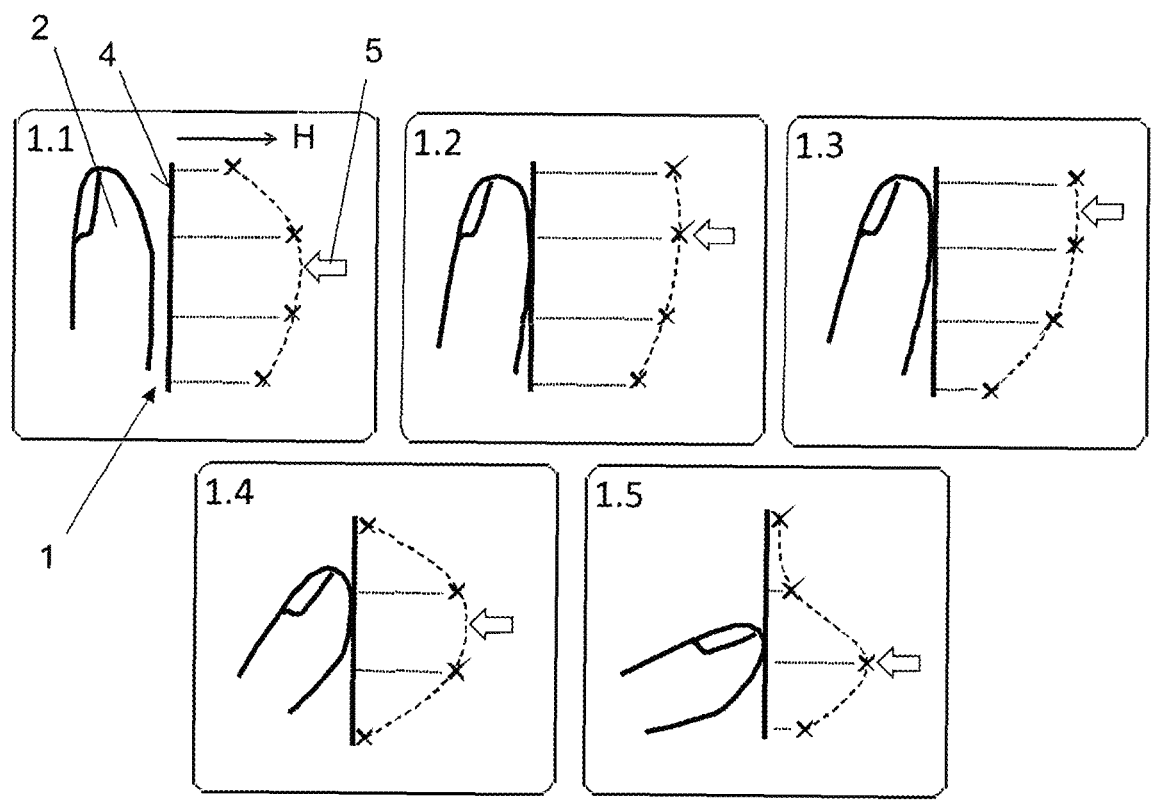
FIG. 2 shows a schematic illustration of sensor strokes measured in sensors during an ergonomically caused rolling movement of a finger on the operating element.

In the illustration in FIG. 2, five images following one another in succession over time are shown, each with different positions of the finger 2 resulting in the respective operating steps 1.1 to 1.5. The reference signs are in each case drawn only in the first operating step 1.1 and ensue analogously for the following steps 1.2 to 1.5. This also applies to the following FIGS. 3, 4, 5 and 8.

The desired movement of the finger 2 is intended to be a downward movement, i.e., for example to reduce the volume. In the first operating step 1.1 of FIG. 2, the user places the extended finger 2, here the thumb, almost parallel to the sensor surface 4. This is usually done when the user grips the steering wheel rim, as is usual while driving, with the other fingers of the hand. This uniform placement results in all individual sensors 3a to 3d being almost completely covered. Depending on the finger shape, there may still be a short distance between the finger 2 and the sensor surface 4 at the upper or lower end of the operating element 1. In this case, the sensor stroke H at the center of the operating element 1 is highest, and a calculation of the finger centroid can still be carried out in a relatively reliable manner here, as indicated by the arrow indicating the calculated finger position 5 located approximately in the center of the operating element 1.

As a result, and this is shown in operating step 1.2, the user drags his finger 2 downwards. However, he simultaneously keeps his hand on the steering wheel rim so that the mechanics of his hand cause the axis of the finger 2, here the thumb, to be displaced, and it accordingly rolls on the sensor surface 4. In this case, the sensor stroke H increases in the region of the upper individual sensor 3a lying at the edge of the sensor 1, while it tends to be decrease at the lower individual sensor 3d. The calculated finger position 5 is therefore shifted upward contrary to the actually intended movement of the finger 2. It should be noted here that, despite the qualitatively different sensor strokes H in this step, the sensor surface 4 of the operating element 1 is essentially still completely covered and therefore still supplies a significant deflection or sensor stroke H in each of the individual sensors 3a to 3d.

In the following shown operating step 1.3, which is to be understood as a continuation of the movement in the operating step 1.2, the calculated centroid of the finger position 5 shifts even further upward, with the only difference being that the sensor stroke of the lower individual sensor 3d begins to decrease very clearly.

In the temporally subsequent operating step 1.4, the axis of the finger 2 is moved further and, at the same time, a fingertip of the finger 2, in this case the thumb, begins to travel significantly downward, which is the direction of movement desired by the user. The sensor stroke H of the uppermost individual sensor 3a begins to decrease correspondingly, and the calculated finger position 5 again approaches the actual finger position. In the final operating step 1.5 of FIG. 2, the finger axis is now steep enough on the sensor surface 4 to allow the finger position 5 to be reliably calculated here. The problem is now that the user believes that he has moved his finger 2 from top to bottom during the entire input and consequently also expects a corresponding system reaction, i.e., for example, a reduction in the volume.

If during steps 1.2 and 1.3 the system instead reacts with a reaction exactly opposite the desired behavior, this is correspondingly irritating and is interpreted by the user as a malfunction or less comfortable input.

Figure 3:
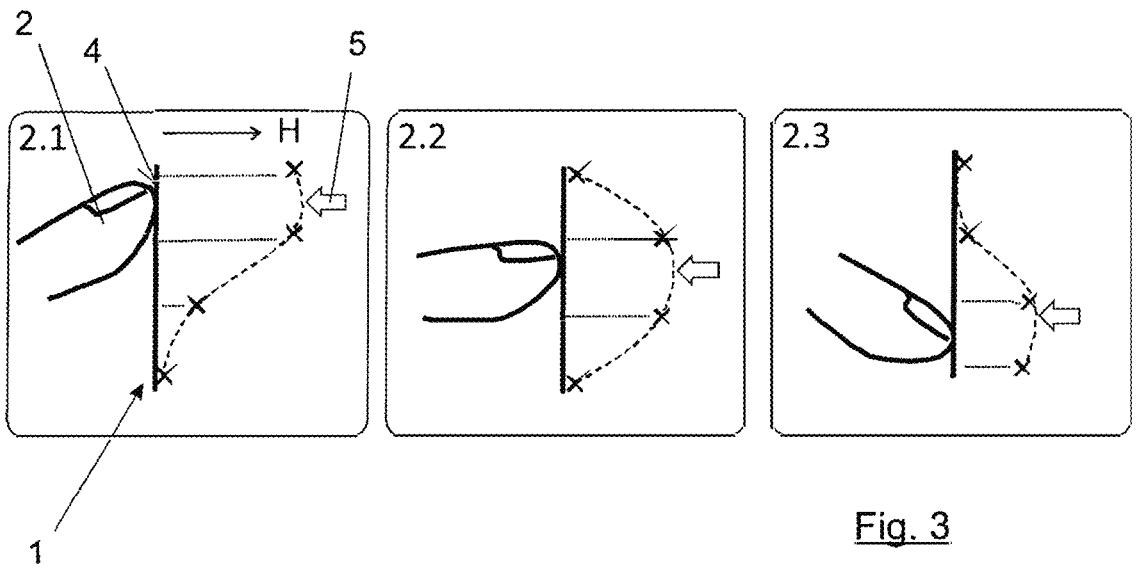
FIG. 3 shows a schematic illustration of a movement of a finger by bending the thumb end joint on an operating element.

If, on the other hand, a largely ideal user input is made by bending the end joint of the thumb, a downward movement results in the operating steps 2.1 to 2.3 shown in the illustration in FIG. 3 in chronological succession. In the operating step 2.1 of FIG. 3, the user has started his input at the upper edge of the operating element 1 or of the sensor surface 4; in contrast to 1.1, step 2.1 does not show initial placement but is already showing a movement. At best, he grips the steering wheel loosely and lifts the wrist far enough out of the steering wheel plane so that the tip of his finger 2, in this case the tip of his thumb, can be moved over the sensor surface 4 simply by bending the thumb end joint. In this operating step, the individual sensors 3a to 3d measure a correspondingly high deflection in the two upper sensors 3a and 3b, while they supply values in the range of background noise in the region of the two lower sensors 3c and 3d. This allows the finger position 5 to be clearly established at the upper region. The movement then continues downwards according to the operating steps 2.2 and 2.3 by the thumb end joint bending so that the finger 2 only covers a small part of the sensor surface 4 during the complete movement, and the finger position 5 can thereby be reliably calculated.

Figure 4:
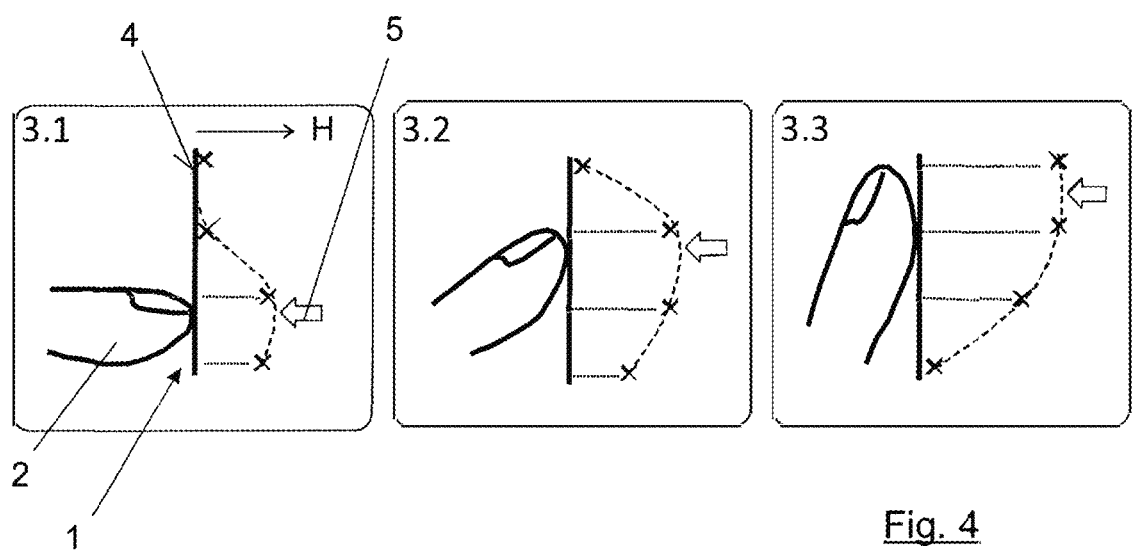
FIG. 4 shows a schematic illustration of a movement by stretching the thumb end joint on the operating element.

In the illustration in FIG. 4, the same movement steps of such an ideal user input for a movement upward, i.e., for example, an increase in the volume in the example mentioned above, are described on the basis of the operating steps 3.1 to 3.3. In the operating steps 3.1 and 3.2, a user input takes place after a prior, upward application of the finger (not shown) by stretching the thumb joint, so that the finger 2 first correspondingly activates the lower sensors 3d and 3c, then the middle sensors 3d and 3c and finally the upper sensors 3a and 3b, and the entire detected movement of the finger position 5 runs in this case in the desired direction of movement, that is to say from bottom to top.

In order to increase the user-friendliness of the operating element 1, primarily the incorrect input explained with reference to FIG. 2 and the operating steps 1.1 to 1.5 therein must be suppressed, while the inputs according to FIGS. 3 and 4 should not be suppressed. In particular, it is noticeable that the depiction of operating step 1.3 and that of operating step 3.3. correspond to each other. Nevertheless, it is important to filter out the input of the unwanted upward direction of movement in a case of FIG. 2, and not to filter out the identical situation regarding the detected strokes H of the sensors 3a to 3d in the other case shown in FIG. 4.

As an essential feature of the faulty recognition of the finger position 5, the almost full-area coverage of the operating element 1 or its sensors 3a to 3d can be detected in particular in FIG. 2. A central approach to correcting the unfortunate reaction of the operating element 1 to such an operation therefore provides that the calculation of the finger position 5 or its transfer to a device controlled by the operating element 1 is canceled when such an almost full-surface coverage of the sensor surface 4 is detected. Such a full-surface coverage of the sensor surface 4 is typically always the case when the smallest sensor stroke H of one of the sensors 3a to 3d is greater than the difference between the largest and the smallest sensor stroke H of the sensors 3a to 3d. The difference $\Delta(min, max)$ must therefore be smaller than a preset value that is preferably formed by the smallest sensor stroke $H_{min}$, in particular together with a scaling factor f1. This first preset value would therefore be the minimum sensor stroke $H_{min}/f1$ in the shown exemplary embodiment or, to allow the scaling factor f1 in the denominator to be omitted, $$H_{min} > f1 * \Delta(min, max) \qquad (I).$$

The scaling factor f1 is essentially dependent on the hardware of the control element 1 and can be defined accordingly, for example, as part of the implementation of the method for a specific structural design, so that no examples will be given here.

Figure 5:
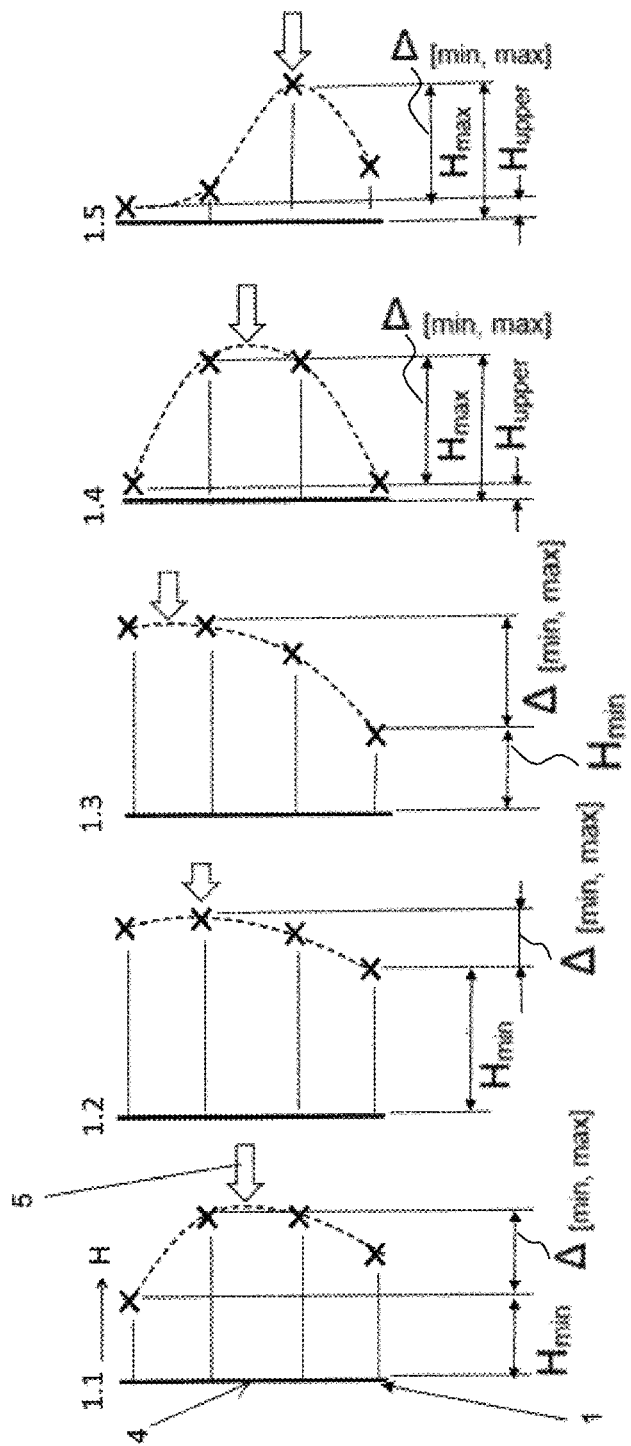
FIG. 5 shows a schematic illustration for explaining a first variant of the method according to the invention on the basis of an illustration analogous to that in FIG. 1.

The solution can be implemented with minimal computational effort, in particular if the query is only carried out in such a way that the condition expressed as a Boolean value change from False to True or vice versa. This condition then defines a rule according to which the output of the finger position 5, which is wrong in operating steps 1.1 and 1.2 of FIG. 2, can be suppressed. In the illustration of FIG. 5, this is accordingly shown again by the indicated values $H_{min}$ and $\Delta(min, max)$. In FIG. 6, the operating steps are likewise again listed in the columns of a table in accordance with the numbering 1.1 to 1.5. The direction of the finger movement calculated by sensor evaluation, the actual finger movement, as well as the direction of the output finger movement are marked with "−" at the bottom and "+" at the top according to FIG. 1. A suppression of the output of the finger position is designated with TRUE, an output of the finger position accordingly occurs given the designation FALSE.

In step 1.1, due to the fact that it is the first detected value at the time of finger placement, a finger position is determined by principle, which is also output, but no finger movement (N/A) has yet been determined. In step 1.2, an upward finger movement is calculated, which is accordingly represented here by the +with reference to the volume slider of FIG. 1, but the actual finger movement intended by the user, denoted by "actual finger movement", is in the downward, opposite direction, which is in turn represented here by the −. The condition $H_{min} > f1 * \Delta(min, max)$ is shown on the third row according to the above formula and changes between the first operating step 1.1 and the second operating step 1.2 from False to True. The flag True for $H_{min} > f1 * \Delta(min, max)$ means that $\Delta(min, max)$ is less than the first preset value, and the condition for an output is not met; the flag False for $H_{min} >> f1 * \Delta(min, max)$ means that the condition for an output is met. Accordingly, as shown on the penultimate row, the outputs are suppressed; this suppression of the output is True in operating step 1.2, and no output (N/A) takes place.

As described above in the explanation of FIG. 2, step 1.3 is also still subject to an erroneous direction of finger movement, as indicated by the "+/−" in the first two rows of the table in FIG. 6, which illustrates the different directions of the calculated finger movement and of that intended by the user.

However, because the sensor stroke H of the lowest sensor 3d is very small here, the first condition is false since the difference between the minimum and maximum sensor stroke $\Delta(min, max)$ is correspondingly greater than the minimum sensor stroke $H_{min}$. In practice, however, this case should be suppressed because the movement is also directed upward here, as has been explained in the context of FIG. 2. An obvious solution may initially be to correspondingly discard the detected finger position and associated direction of movement for all future operating steps when the first condition is changed to True. However, this would result in a deliberate reversal of the direction of movement by the user not being detected, which also significantly reduces the comfort of the input. However, it is now the case that in this configuration, between operating steps 1.3 and 1.4, the tip of the finger 2 moves increasingly away from the upper sensor 3*a*. Such a distance from the sensor 3*a* to 3*d* closest to the tip of the finger 2, in this case the sensor 3*a*, which is arranged at the edge of the operating element 1, therefore indicates that the finger position 5 can be reliably delimited upward. From this time, there is no longer any need to artificially limit the finger movement in order to make it possible for the user to reverse the finger movement without having to reset the operating element in between by lifting off his finger.

As a second condition, which would have to be checked subsequently to the first condition $H_{min} > f1*\Delta(min, max)$ mentioned above, there is therefore a check as to whether the sensor stroke $H_{upper}$ of the uppermost sensor 3*a* is smaller than the highest measured sensor stroke $H_{max}$. Here too, a scaling factor f2 can again play a role which can be determined similarly to the first scaling factor f1, for example during the implementation. The formula for the second condition is then:

$$H_{upper} < f2*H_{max} \qquad (II).$$

The flag True indicates that the sensor stroke ($H_{upper}$) of a sensor (3*a*) closest to the detected finger position at the edge of the touch-sensitive capacitive operating element (1) is smaller than the second preset value, and the condition is met. With these two conditions I and II, a sequence can now be defined as follows: The input starts, the first condition I is incorrect, and a regular output of the finger position calculation takes place which corresponds to the operating step 1.1 in the illustration in FIGS. 5 and 6. Subsequently, the condition I changes from False to True, and the output in operating step 1.2 is correspondingly suppressed, since a True for condition 1 causes a suppression of output. In the third operating step, the condition I changes again to False, and the condition II is likewise incorrect so that, although the output is not suppressed due to the condition I, it is still suppressed due to condition II because a False of condition 1 suppresses the output. Only in the subsequent step is the second condition II True when the first condition I is False, and a regular output takes place, which is then maintained for the operating steps 1.4 and 1.5. (False in condition 1 and True in condition 2 leads to a regular output described by False).

In the table in FIG. 7, the procedure just described is correspondingly applied in an analogous illustration to the operating steps 2.1 to 2.3 and 3.1 to 3.3 shown in FIGS. 3 and 4. As expected, there is no suppression of the output of the finger position and the finger movement since, as mentioned in the description of FIGS. 3 and 4, a quasi-ideal use of the operating element 1 is here the case.

The only aspect that is noticeable here relatively quickly is the state shown in the last operating step 3.3. With regard to the detected sensor strokes H of the sensors 3*a* to 3*d*, this corresponds exactly to the state shown in operating step 1.3. In the case of 1.3 it is a misinterpretation, which is suppressed with regard to the output by the second condition II becoming false. However, such a procedure would not be expedient here since the finger position 5 determined in the operating step 3.3 is exactly the one which is intended and desired by the user. The difference arising here from the above-described sequence is that the first condition I has changed from True to False between the operating steps 1.2 and 1.3, while the first condition I has not changed between the operating steps 3.2 and 3.3 due to the other direction of movement. So if there is no change in the first condition I between two operating steps or finger positions 5 determined therefrom, in particular in the case of an upward "+" direction of movement determined by calculation on the basis of the sensor signals, then the check of the second condition can be dispensed with completely in the second of the operating steps, so that even in the case of a change in the second condition II $H_{upper} < f2*H_{max}$ from True to False, as is the case here, this change does not lead to a suppression of the output as in the table in FIG. 6. The False of the second condition is therefore correspondingly shown there in parentheses.

Alternatively, the second condition II is only considered for a calculated direction of movement, namely from top to bottom "−", and is not considered in the opposite direction from bottom to top "+", so that with a corresponding reversal of the direction of movement, the direction of movement corresponding to the user's request is output.

Further refinements of the method are also possible, in particular to suppress the transfer of the finger position 5 in borderline cases exactly when this is desired, and not to block it when it is not desired. Such a refinement can be based, for example, on the consideration that, when there is full coverage of the sensor surface 4, minimal changes in the particular sensor strokes H can lead to immense fluctuations in the calculated finger position 5. In practice, this then leads to a high-frequency oscillation of the output signal, i.e., a very strong detected movement speed of the change in finger positions 5. In order to overcome the problem, a permissible maximum speed of the movement of the finger position 5 can therefore be defined in addition to the method described above in order to discard all faster changes. Since the operating patterns vary greatly in nature and speed depending on the user, for example due to the typical hand position on the steering wheel, the size of the hand and the like, it cannot be readily assumed that a single fixed value for the maximum speed guarantees the best comfort. For this reason, an individual value can be independently determined for each user over time on the basis of the operation of the control element 1, set and adjusted as needed, which leads to comfortable and reliable operation of the control element 1.

The calculation steps presented so far are arithmetically very simple and can also be carried out very efficiently even on systems with very limited computing power, for example a controller or the computing unit 6 of the operating element 1 itself.

Alternatively, or in particular in addition to the query of the condition I, a refinement could now also be realized via an error observation of the system, which could provide a quantitative estimation of the error with which the calculated finger position 5 is afflicted in sufficient time. Such an estimation can, for example, be made based on Gaussian error propagation, with which a simple procedure complementary or also supplementary to the other embodiment with condition I can be defined, in which the finger position change $\Delta X(T)$ calculated in a defined time interval T is smaller than the error interval $\delta X$ of the finger position 5, which can, if necessary, be multiplied again by a corresponding factor $f_3(X)$ dependent here on the location. The formula would then be:

$$\Delta X(T) < \delta(X) \cdot f_3(X) \qquad (III).$$

Figure 8:
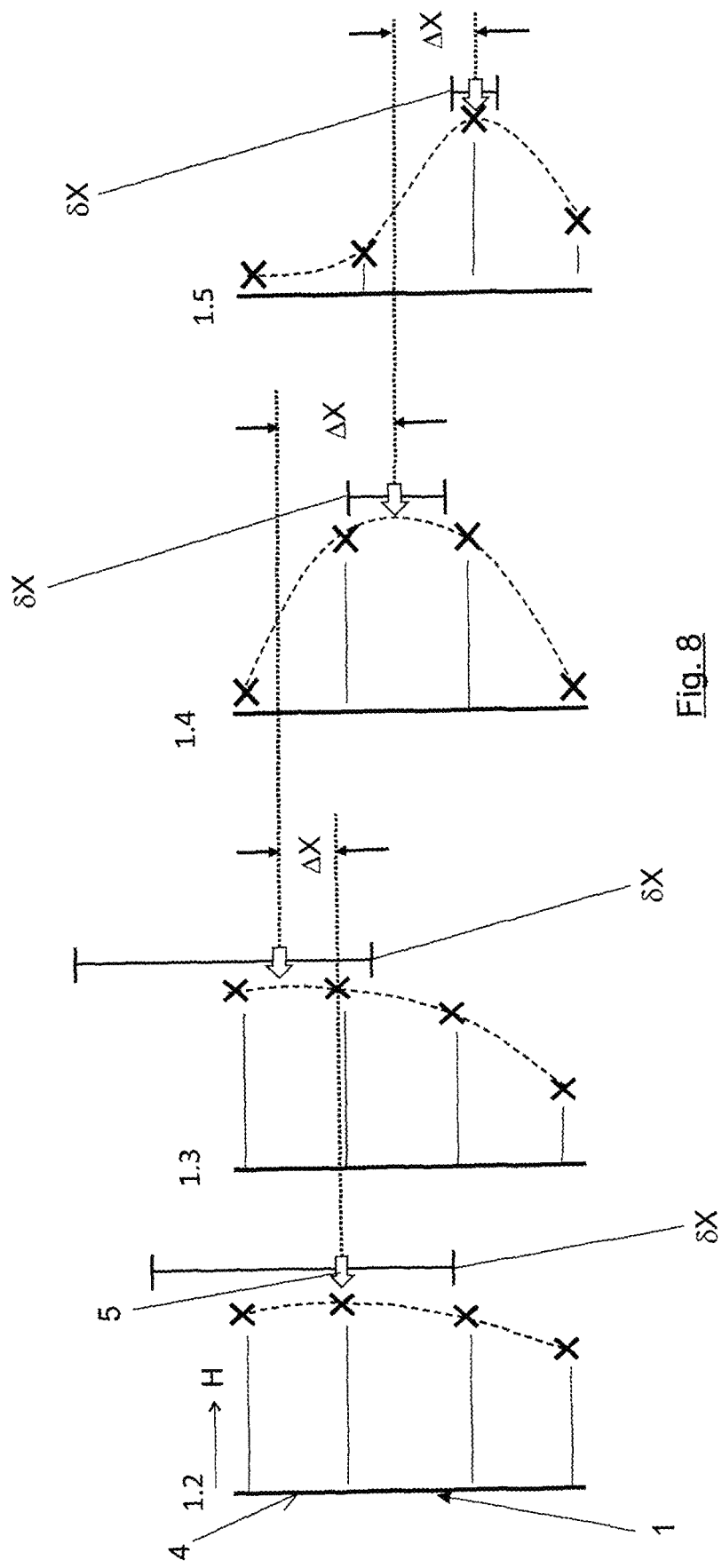
FIG. 8 shows an alternative embodiment of the method according to the invention based on the sequence according to the illustration in FIG. 2.

If this condition III is met, the output of the finger position 5 will be suppressed so that this query, assuming sufficient computing power, can be determined instead of the check of the condition I or even before or after in addition to this check of the condition I. In the illustration of FIG. 8, the corresponding values are again shown in the operating steps 1.2 to 1.5 analogously to those in the illustration in FIGS. 2 and 5.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the invention, which is defined by the claims and their legal equivalents, such as further explanations in the description.

The invention claimed is:

1. A method, comprising:
    detecting an input made by a finger on a touch-sensitive capacitive operating element comprising at least two capacitive sensors;
    calculating a finger position using sensor strokes of individual capacitive sensors of the at least two capacitive sensors at a same time,
    wherein the calculated finger position is not output when a difference between a maximum and minimum sensor stroke of the at least two capacitive sensors is smaller than a first preset value, and
    wherein the calculated finger position is output when the difference between the maximum and minimum sensor stroke of the at least two capacitive sensors is greater than the first preset value, and when the sensor stroke of a capacitive sensor, of the at least two capacitive sensors, closest to the calculated finger position at an edge of the touch-sensitive capacitive operating element is smaller than a second preset value.

2. The method of claim 1, wherein the smaller the first present value is, the smaller is the permissible difference between the maximum and minimum sensor stroke of the sensors from which there is no output.

3. The method of claim 1, wherein the first preset value is dependent on the minimum sensor stroke.

4. The method of claim 1, wherein the second preset value is dependent on the maximum sensor stroke.

5. The method of claim 1, wherein all changes of the calculated finger position, which are based on a detected movement speed of the finger above a predefined maximum movement speed, are not output.

6. The method of claim 1, wherein when the difference) between the maximum and minimum sensor stroke of the at least two capacitive sensors of two successive finger positions is greater in each case than the first preset value, the comparison of the sensor stroke with the second preset value is omitted for a last finger position and the calculated finger position is output.

7. A touch-sensitive operating element, comprising:
    a computing unit; and
    a plurality of capacitive sensors arranged in a row and which are configured to be operated in a direction of movement from top to bottom, and vice versa, wherein the touch-sensitive operating element is configured to
    detect an input made by a finger on the touch-sensitive capacitive operating element using the plurality of capacitive sensors;
    calculate a finger position using sensor strokes of individual capacitive sensors of the plurality of capacitive sensors at a same time,
    wherein the calculated finger position is not output when a difference between a maximum and minimum sensor stroke of the plurality of capacitive sensors is smaller than a first preset value, and
    wherein the calculated finger position is output when the difference between the maximum and minimum sensor stroke of the plurality of capacitive sensors is greater than the first preset value, and when the sensor stroke of a capacitive sensor, of the plurality of capacitive sensors, closest to the calculated finger position at an edge of the touch-sensitive capacitive operating element is smaller than a second preset value.

* * * * *